(12) United States Patent
Fang et al.

(10) Patent No.: US 12,354,676 B2
(45) Date of Patent: Jul. 8, 2025

(54) METHOD FOR MANAGING THRESHOLD VOLTAGE, AND METHOD FOR READING FLASH DATA

(71) Applicant: DapuStor Corporation, Shenzhen (CN)

(72) Inventors: Haojun Fang, Shenzhen (CN); Yunxin Huang, Shenzhen (CN)

(73) Assignee: DapuStor Corporation, Shenzhen (CN)

( * ) Notice: Subject to any disclaimer, the term of this patent is extended or adjusted under 35 U.S.C. 154(b) by 205 days.

(21) Appl. No.: 18/201,757

(22) Filed: May 24, 2023

(65) Prior Publication Data

US 2023/0298676 A1 Sep. 21, 2023

Related U.S. Application Data

(63) Continuation of application No. PCT/CN2021/121392, filed on Sep. 28, 2021.

(30) Foreign Application Priority Data

Dec. 23, 2020 (CN) .......................... 202011556493.9

(51) Int. Cl.
*G11C 16/34* (2006.01)
*G11C 16/04* (2006.01)
*G11C 16/26* (2006.01)

(52) U.S. Cl.
CPC ...... *G11C 16/3404* (2013.01); *G11C 16/0483* (2013.01); *G11C 16/26* (2013.01)

(58) Field of Classification Search
CPC .. G11C 16/3404; G11C 16/0483; G11C 16/26
USPC ...................................................... 365/185.24
See application file for complete search history.

(56) References Cited

U.S. PATENT DOCUMENTS

| | | | |
|---|---|---|---|
| 9,244,763 B1 * | 1/2016 | Kankani | G06F 11/1068 |
| 9,454,420 B1 | 9/2016 | Tai et al. | |
| 2013/0343131 A1 * | 12/2013 | Wu | G11C 16/3418 365/185.24 |

(Continued)

FOREIGN PATENT DOCUMENTS

| | | | |
|---|---|---|---|
| CN | 106448737 A | 2/2017 | |
| CN | 108986867 A | 12/2018 | |

(Continued)

OTHER PUBLICATIONS

International Search Report in related PCT Application No. PCT/CN2021/121392 dated Dec. 22, 2021 (6 pages).

*Primary Examiner* — Alexander Sofocleous
*Assistant Examiner* — Duy H Luong
(74) *Attorney, Agent, or Firm* — Bayes PLLC

(57) ABSTRACT

The present application provides a method for managing a threshold voltage, a method for reading flash data, a solid state disk controller, and a solid state disk. The method for managing a threshold voltage includes: acquiring a target block with a specific region, the specific region having a determined first piece of cell state distribution information; and when a preset scanning interval is reached, scanning the threshold voltage based on the specific region of the target block, the first piece of cell state distribution information, and an optimal threshold voltage table, and periodically managing the optimal threshold voltage table.

20 Claims, 5 Drawing Sheets

(56) References Cited

U.S. PATENT DOCUMENTS

| | | | |
|---|---|---|---|
| 2017/0125111 A1* | 5/2017 | Sankaranarayanan | ........................ G06F 11/0793 |
| 2018/0342305 A1* | 11/2018 | Cha | .................... G11C 13/0033 |
| 2019/0198069 A1* | 6/2019 | Kale | ........................ G11C 29/36 |
| 2019/0303239 A1* | 10/2019 | Hsiao | .................. G06F 12/0246 |
| 2021/0132804 A1* | 5/2021 | Hong | .................. G11C 11/5642 |
| 2021/0224151 A1* | 7/2021 | Lee | ...................... G11C 29/021 |
| 2022/0130472 A1* | 4/2022 | Zhang | ................ G11C 11/5642 |
| 2022/0375531 A1* | 11/2022 | Ock | .................. G11C 29/1201 |

FOREIGN PATENT DOCUMENTS

| | | |
|---|---|---|
| CN | 109065092 A | 12/2018 |
| CN | 111445942 A | 7/2020 |
| CN | 111459413 A | 7/2020 |
| CN | 112562766 A | 3/2021 |
| CN | 112599177 A | 4/2021 |

\* cited by examiner

| BLK No. | Threshold table ||||||| 
| --- | --- | --- | --- | --- | --- | --- | --- |
|  | V1 | V2 | V3 | V4 | V5 | V6 | V7 |
| 0 | B0Vt1 | B0Vt2 | B0Vt3 | B0Vt4 | B0Vt5 | B0Vt6 | B0Vt7 |
| 1 | B1Vt1 | B1Vt2 | B1Vt3 | B1Vt4 | B1Vt5 | B1Vt6 | B1Vt7 |
| . | . | . | . | . | . | . | . |
| . | . | . | . | . | . | . | . |
| n-1 | Bn-1Vt1 | Bn-1Vt2 | Bn-1Vt3 | Bn-1Vt4 | Bn-1Vt5 | Bn-1Vt6 | Bn-1Vt7 |
| n | BnVt1 | BnVt2 | BnVt3 | BnVt4 | BnVt5 | BnVt6 | BnVt7 |

| Miscellaneous | record time stamp | Optimal threshold voltage value | Initial threshold voltage value |
| --- | --- | --- | --- |

METHOD FOR MANAGING THRESHOLD VOLTAGE, AND METHOD FOR READING FLASH DATA

CROSS-REFERENCE TO RELATED APPLICATIONS

The present application is a continuation of International Application No. PCT/CN2021/121392, filed on Sep. 28, 2021, which claims the benefit of priority to Chinese Application No. 202011556493.9 filed on Dec. 23, 2020. The entire contents of both applications are expressly incorporated herein by reference.

TECHNICAL FIELD

The present application relates to the field of solid state disk applications, and in particular to, a method for managing a threshold voltage and a method for reading flash data.

BACKGROUND

NAND flash is a main storage medium for solid state disks. With the development of flash technologies, some problems have arisen, such as increasingly high uncorrectable bit error rate (UBER). In order to reduce this uncorrectable bit error rate, it is necessary to adjust a threshold voltage before read retry. The key to the success of read retry is the determined threshold voltage.

Related technologies are usually to scan the optimal threshold voltage in real time. This process will first set a threshold voltage, then perform a read operation, and then calculate a bit error rate of a current read operation. This process is repeated multiple times, and a threshold voltage corresponding to a smallest bit error rate is finally selected for use as an optimal threshold voltage.

The related technologies in prior art have at least the following problems: during the optimal threshold voltage scanning, a data channel of corresponding flash particles will be occupied, while the optimal threshold voltage scanning generally will involve multiple read operations, which is time-consuming and delays other read and write operations; and if optimal threshold voltage scanning and then reading are performed each time an uncorrectable error occurs, it is a significant delay for a host terminal, and multiple occurrences will affect the overall performance.

SUMMARY

The technical problems solved by embodiments of the present application are how to improve the efficiency of obtaining an optimal threshold voltage, thereby effectively using the optimal threshold voltage and reducing the impact on performance.

In order to solve the aforementioned technical problems, one technical solution adopted in the embodiments of the present application is to provide a method for managing threshold voltage, including:
  acquiring a target block, the target block being provided with a specific region, the specific region having a determined first piece of cell state distribution information; and
  scanning the threshold voltage based on the specific region of the target block, the first piece of cell state distribution information, and an optimal voltage table when a preset scanning interval is reached, to periodically manage the optimal threshold voltage table.

In some embodiments, the specific region includes a word line in the target block, the word line including a preset data sequence for generating the first piece of cell state distribution information.

In some embodiments, the scanning the threshold voltage based on the specific region of the target block, the first piece of cell state distribution information, and the optimal threshold voltage table includes:
  performing a read operation on the specific region respectively according to each threshold voltage recorded in the optimal threshold voltage table, and acquiring a second piece of cell state distribution information corresponding to the each threshold voltage;
  acquiring an offset parameter of the each threshold voltage according to the first piece of cell state distribution information and the second piece of cell state distribution information; and
  updating each threshold voltage recorded in the optimal threshold voltage table according to the offset parameter.

In some embodiments, the acquiring the offset parameter of the each threshold voltage according to the first piece of cell state distribution information and the second piece of cell state distribution information includes:
  acquiring an initial number of cells and an initial record value according to the first piece of cell state distribution information;
  acquiring a current number of cells and a current record value corresponding to the each threshold voltage according to the second piece of cell state distribution information; and
  comparing the initial number of cells with the current number of cells to obtain an offset direction of the each threshold voltage, and comparing the initial record value with the current record value to obtain an offset degree of the each threshold voltage.

In some embodiments, the updating each threshold voltage recorded in the optimal threshold voltage table according to the offset parameter includes:
  determining the adjusted threshold voltage according to the offset direction and the offset degree of the threshold voltage, and updating and recording the adjusted threshold voltage in the optimal threshold voltage table.

In some embodiments, the method further includes:
  acquiring an updated threshold voltage in the optimal threshold voltage table and an initial threshold voltage corresponding to the updated threshold voltage;
  computing an offset amount between the updated threshold voltage and the initial threshold voltage; and
  performing a data transfer operation when the offset amount is greater than a set threshold.

In order to solve the above technical problems, another technical solution adopted in the embodiments of the present application is to provide a method for reading flash data, including:
  reading data in a NAND flash according to a received read command:
  acquiring an optimal threshold voltage according to an optimal threshold voltage table if there is an uncorrectable error in the process of reading the flash data; where the optimal threshold voltage table is determined according to the method for managing a threshold voltage as mentioned above; and re-performing a read operation according to the optimal threshold voltage to read the flash data.

In some embodiments, when the re-performing the read operation according to the optimal threshold voltage fails, the method further includes:
performing an optimal threshold voltage scanning to obtain the optimal threshold voltage;
performing a read operation for the target region according to the obtained optimal threshold voltage; and
performing a data transfer operation on the data corresponding to the read command when the read operation succeeds.

In order to solve the above technical problems, still another technical solution adopted in the embodiments of the present application is to provide a solid state disk controller, including: one or more processors; and a memory;
where the memory stores a program, and when the program is executed by the one or more processors, the program causes the solid state disk controller to execute the method for managing a threshold voltage as mentioned above and the method for reading flash data as mentioned above.

In order to solve the above technical problems, yet another technical solution adopted in the embodiments of the present application is to provide a solid state disk, including: the above solid state disk controller and at least one flash medium communicatively connected to the solid state disk controller.

In order to solve the above technical problems, still yet another technical solution adopted in the embodiments of the present application is to provide a computer program product, including a computer program stored on a solid state disk, where the computer program includes program instructions, and the program instructions, when executed by a solid state disk controller, cause the solid state disk controller to execute the method for managing a threshold voltage as mentioned above and the method for reading flash data as mentioned above.

Different from the situation in related technologies, the method for managing threshold voltage, the method for reading flash data, the solid state disk controller, and the solid state disk provided in the embodiments of the present application periodically scan a threshold voltage, establish an optimal threshold voltage table, and manage the optimal threshold voltage table, where in the process of managing the threshold voltage, the scanning the threshold voltage is performed for a specific region of a target block. When an uncorrectable error occurs during data reading, an optimal threshold voltage can be directly obtained from the optimal threshold voltage table, to perform a read retry operation. The optimal threshold voltage scanning in the embodiments of the present application is performed periodically, and is not performed when necessary, thereby improving the efficiency of obtaining the optimal threshold voltage. The threshold voltage scanning is performed for the specific region, thereby reducing the number of read operations during scanning, and improving the efficiency of obtaining the optimal threshold voltage. In addition, the periodic scanning is equivalent to real-time tracking of the optimal threshold voltage, so that it is feasible to detect threshold voltage offset to a risk point as early as possible. For example, when an offset between the optimal threshold voltage and an initial threshold voltage is greater than a set threshold, data transfer is triggered, thereby reducing occurrence of uncorrectable errors due to further offset. To sum up, the method for managing a threshold voltage, the method for reading flash data, the solid state disk controller, and the solid-state disk provided in the embodiments of the present application improve the efficiency of obtaining the optimal threshold voltage, thereby reducing delay impact of other read and write operations, achieving effective application of the optimal threshold voltage, and improving system performance.

BRIEF DESCRIPTION OF DRAWINGS

The embodiments are illustrated with reference to corresponding figures thereof, but these illustrations do not constitute a limitation on the embodiments. Elements with identical reference numerals in the drawings represent similar elements, and unless otherwise particularly stated, the figures in the drawings do not constitute a limitation to scale.

DETAILED DESCRIPTION

To make the objectives, technical solutions, and advantages of embodiments of the present application clearer, the technical solutions in the embodiments of the present application will be described below with reference to the drawings of the present application. Apparently, the embodiments described below are a part, instead of all, of the embodiments of the present application. All other embodiments obtained by those of ordinary skills in the art based on the embodiments of the present application without making creative work are encompassed within the scope of protection of the present application.

In addition, the technical features involved in various embodiments of the present application described below may be combined with each other as long as they do not conflict with each other.

The method for managing a threshold voltage and the method for reading flash data provided in the embodiments of the present application periodically scan a threshold voltage, establish an optimal threshold voltage table, and maintain and update the optimal threshold voltage table. When an uncorrectable error occurs during data reading, read retry may be performed using the optimal threshold voltage in the optimal threshold voltage table. If the read retry succeeds, real-time optimal threshold voltage scanning is not required; and if the read retry fails, the real-time optimal threshold voltage scanning may be performed. The processes of periodic threshold voltage scanning and real-time optimal threshold voltage scanning may be performed using a preset data sequence in a specific region. In addition, if an offset between the obtained optimal threshold voltage and an initial threshold voltage is greater than a set threshold, data transfer is performed to protect data. In general, the embodiments of the present application can obtain a real-time optimal threshold voltage, which can find a lowest UBER to complete error correction, so as to protect the data to the greatest extent.

Figure 1:
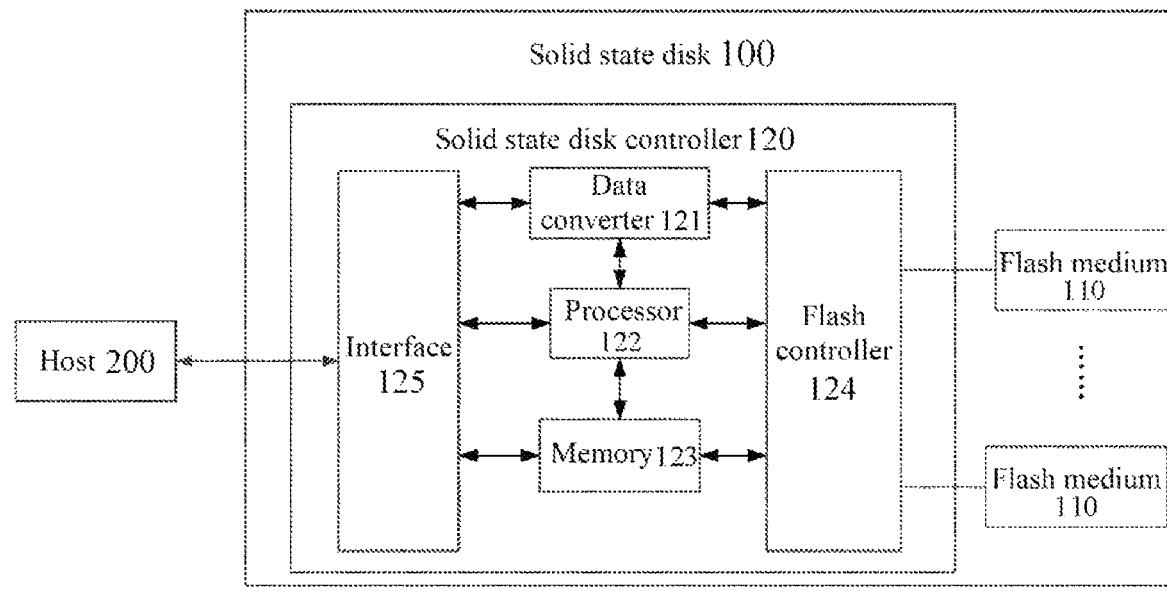
FIG. 1 is a schematic structural diagram of a solid state disk provided in an embodiment of the present application.

Referring to FIG. 1, a schematic structural diagram of a solid state disk provided in an embodiment of the present application is shown. As shown in FIG. 1, the solid state disk 100 includes a flash medium 110 and a solid state disk controller 120 connected to the flash medium 110. The solid state disk 100 is communicatively connected to a host 200 wiredly or wirelessly, to implement data interaction. The solid state disk stores computer-executable instructions, which are executed by one or more processors, such as a processor 122 in FIG. 2, to cause the above one or more processors to execute the method for managing a threshold voltage or the method for reading flash data in any of the above method embodiments, for example, executing step 101 to step 102 of the method in FIG. 3, step 301 to step 305 of the method in FIG. 7, and step 401 to step 403 of the method in FIG. 9.

As a storage medium of the solid state disk 100, the flash medium 110 is also known as NAND flash, flash, flash memory, or flash particle, belongs to memory devices, is a non-volatile memory, can store data for a long time even in the absence of current supply, and has equivalent storage characteristics to a hard disk, such that the flash medium 110 becomes the basis of storage mediums for all kinds of portable digital devices.

The flash medium 110 may be a NAND flash which uses a single transistor as the storage unit for binary signals, and has a very similar structure to an ordinary semiconductor transistor except that a floating gate and a control gate are added into the single transistor of the NAND flash, where the floating gate is used for storing electrons, is coated by a layer of silicon oxide insulator on the surface, and is coupled with the control gate through a capacitor. When negative electrons are injected into the floating gate under the action of the control gate, the storage state of the single crystal of the NAND flash changes from "1" to "0," and when the negative electrons are removed from the floating gate, the storage state changes from "0" to "1." The insulator coated on the surface of the floating gate is used for trapping the negative electrons in the floating gate, to implement data storage. That is, the storage unit of the NAND flash is a floating gate transistor, which is used to store data in the form of charges. The amount of stored charges is associated with a size of a voltage applied to the floating gate transistor.

A NAND flash includes at least one chip. Each chip includes several physical blocks, and each of the physical blocks includes several pages. The physical block is a smallest unit for the Nand flash to execute an erasure operation, the page is a smallest unit for the Nand flash to execute a read/write operation, and the capacity of one Nand flash is equal to the number of its physical blocks*the number of pages included in a physical block*the capacity of one page. In some embodiments, the flash medium 10 may be divided into SLC, MLC, TLC, and QLC according to different voltage levels of the storage unit.

Figure 2:
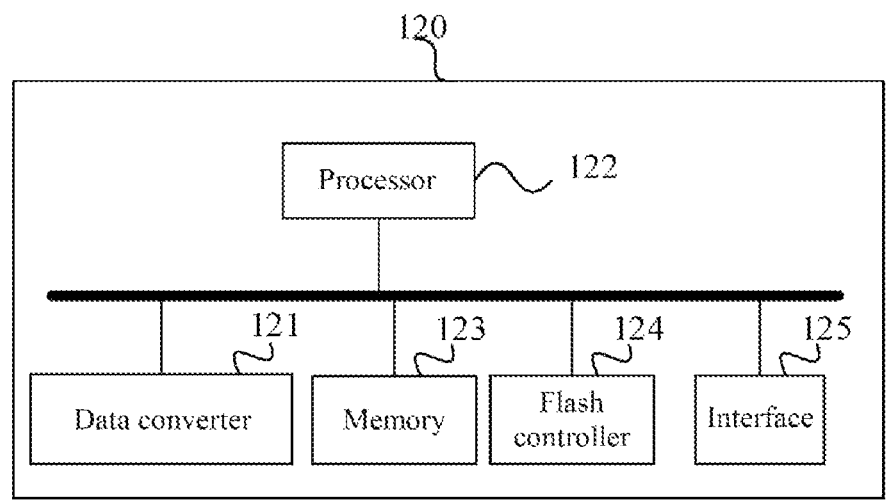
FIG. 2 is a schematic structural diagram of a solid state disk controller 120 provided in an embodiment of the present application.

Referring to FIG. 2, the solid state disk controller 120 includes a data converter 121, a processor 122, a memory 123, a flash controller 124, and an interface 125.

The data converter 121 is connected to the processor 122 and the flash controller 124 respectively. The data converter 121 is configured to convert binary data into hexadecimal data, and convert hexadecimal data into binary data. In some embodiments, when the flash controller 124 writes data into the flash medium 110, to-be-written binary data is converted into hexadecimal data through the data converter 121, and then the converted data is written into the flash medium 110. When the flash controller 124 reads data from the flash medium 110, the hexadecimal data stored in the flash medium 110 is converted into binary data through the data converter 121, and then the converted data is read from a binary data page register. The data converter 121 may include a binary data register and a hexadecimal data register. The binary data register can be configured to save binary data converted from hexadecimal data, and the hexadecimal data register can be configured to save hexadecimal data converted from binary data.

The processor 122 is connected to the data converter 121, the memory 123, the flash controller 124, and the interface 125, respectively, where the processor 122 may be connected to the data converter 121, the memory 123, the flash controller 124, and the interface 125 through a bus or other means, and the processor is configured to run non-volatile software programs, instructions, and modules stored in the memory 123, so as to implement the method embodiments of the present application. For example, the processor 122 is configured to acquire a target block, the target block being provided with a specific region, the specific region having a determined first piece of cell state distribution information; and scan a threshold voltage based on the specific region of the target block, the first piece of cell state distribution information, and an optimal threshold voltage table when a preset scanning interval is reached, to periodically manage the optimal threshold voltage table.

The memory 123 is mainly configured to cache read/write instructions sent from the host 200 and read data or write data acquired from the flash medium 110 according to the read/write instructions sent from the host 200. As a non-volatile computer-readable storage medium, the memory 123 may be configured to store non-volatile software programs, non-volatile computer-executable programs, and modules. The memory 123 may include a program storage area, where the program storage area may store an operating system and an application required by at least one function. Further, the memory 123 may include a high-speed random access memory, and may further include a non-volatile memory, such as at least one disk memory device, a flash device, or other non-volatile solid-state memory device. In some embodiments, the memory 123 includes memories disposed remotely relative to the flash controller 124. Examples of the above network include, but are not limited to, the Internet, an intranet, a local area network, a mobile communication network, and a combination thereof. The memory 123 may be a Static Random Access Memory (SRAM), or a Tightly Coupled Memory (TCM), or a double DataRate Synchronous Dynamic Random Access Memory (DDR SRAM).

The flash controller 124 is connected to the flash medium 110, the data converter 121, the processor 122, and the memory 123, and is configured to access a back-end flash medium 110, and managing various parameters and data I/O of the flash medium 110; or, is configured to provide access interfaces and protocols, implement corresponding SAS/SATA target protocol terminals or NVMe protocol terminals, acquire I/O instructions sent from the host 200, and decode the I/O instructions to generate internal private data results for execution; or, is configured to be responsible for core processing of a Flash translation layer (FTL).

The interface 125 is connected to the host 200, the data converter 121, the processor 122, and the memory 123, and is configured to receive data sent from the host 200, or receive data sent from the processor 122, to implement data transmission between the host 200 and the processor 122. The interface 125 may be SATA-2 interface, SATA-3 interface, SAS interface, MSATA interface, PCI-E interface, NGFF interface, CFast interface, SFF-8639 interface, and M.2 NVME/SATA protocol.

The solid state disk provided in the embodiments of the present application supports a mode of periodically obtaining an optimal threshold voltage in real time and a mode of real-time optimal threshold voltage scanning, where the optimal threshold voltage scanning is performed for a specific region into which a preset data sequence is written, thereby reducing the number of read operations during scanning, improving the efficiency of obtaining the optimal threshold voltage on the whole, and improving performance of the solid state disk.

The above product can execute the method provided in the embodiments of the present application, and has corresponding function modules for executing the method and beneficial effects. The method provided in the embodiments of the present application may be referred to for the technical details that are not described in detail in the present embodiment.

Figure 3:
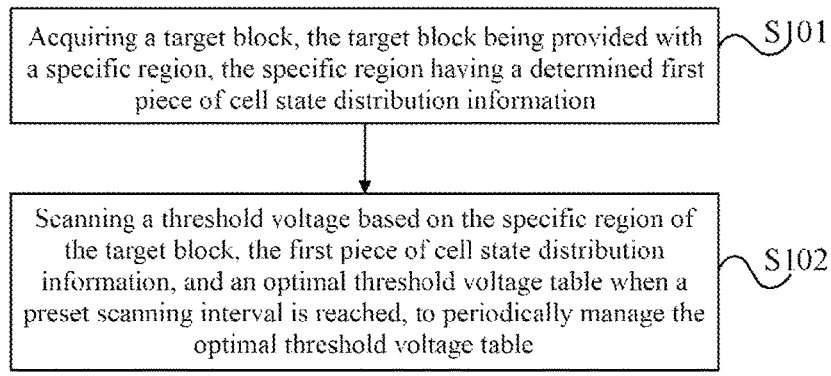
FIG. 3 is a flowchart of a method for managing a threshold voltage provided in an embodiment of the present application.

Referring to FIG. 3, a flowchart of a method for managing a threshold voltage provided in some embodiments of the present application is shown. The method may be applied to the above solid state disk, and may be applied to the above solid state disk controller. The method includes:

S101: acquiring a target block, the target block being provided with a specific region, the specific region having a determined first piece of cell state distribution information.

In some embodiments, a word line in a target block is used as a specific region for threshold voltage scanning. A preset data sequence is pre-written into the specific region, and the preset data sequence is used for generating the determined first piece of cell state distribution information, thereby knowing about state distribution information of all cells within the word line. The pre-known first piece of cell state distribution information can be used for ascertaining an offset direction and an offset degree of the threshold voltage in subsequent threshold voltage scanning process. Since the offset direction is known, the number of operations will not be wasted in a process of trying to ascertain the direction. Since the offset degree is known, the accuracy of a step value can be improved, thereby reducing the number of operations in this process on the whole.

In some embodiments, before the acquiring the target block, the method further includes:
selecting a specific data pattern;
computing and saving cell state distribution information corresponding to the specific data pattern;
selecting the specific region in the target block;
writing the specific data pattern into the specific region; and
performing an optimal threshold voltage scanning for the specific region, using the obtained threshold voltage as an initial threshold voltage, and saving the initial threshold voltage.

The acquiring the target block means to acquire a block that includes the specific region into which the specific data pattern is written. A pattern is a determined data sequence, such as 0x5A5A.

The specific region may be a word line in the target block.

When the target block includes a plurality of blocks, the same specific data pattern may be written into each target block, so that after the specific data pattern is written, only one kind of cell state distribution information is generated in all target blocks, thus facilitating information recording and tracking.

According to characteristics of the NAND flash, the same block more probably has offset consistency. Therefore, it is advisable to use the target block as a tracking granularity in the present embodiment.

In some embodiments, a word line of the target block is set as the specific region, and a first word line or a last word line in the target block may be selected as the word line for use as the specific region, thereby facilitating finding the specific region. It should be noted that in other embodiments, more word lines, such as 2 word lines or 3 word lines, may be selected for use as the specific region.

S102: scanning the threshold voltage based on the specific region of the target block, the first piece of cell state distribution information, and an optimal threshold voltage table when a preset scanning interval is reached, to periodically manage the optimal threshold voltage table.

The preset scanning interval is a preset time period, and the optimal threshold voltage scanning is executed every time when the time period is reached. The preset scanning interval may be determined based on empirical values, such as 1 day. The preset scanning interval may be associated with the number of erasures. For example, if the number of erasures increases, the scanning interval is shortened. In addition, for consumer/enterprise level, factors such as SLC/TLC will also affect the scanning interval. For example, the consumer level has low requirements for data errors, so that the scanning interval can be extended, while the enterprise level has high requirements for data errors, so that the scanning interval can be shortened.

The optimal threshold voltage table includes at least one optimal threshold voltage. It can be known that the NAND flash is a non-volatile storage medium, which is characterized in that electrons can be stored in one cell, and the number of stored electrons can be presented as a voltage value. After data is written, the number of stored electrons can be presented as a voltage value, and a read value is ascertained depending on comparison between a voltage value and a reference voltage (or called the threshold voltage) of the cell. Due to the influence of many factors, after write is completed, some cells will be mis-ascertained, i.e., their values are error bits for read. These bits need to be corrected using error correction technology. When the error correction capability is definite, the threshold voltage should be set to minimize mis-ascertained bits, so that the set threshold voltage is the optimal threshold voltage, and a process of resetting the threshold voltage is a process of finding the optimal threshold voltage.

The scanning the threshold voltage based on the specific region of the target block, the first piece of cell state distribution information, and the optimal threshold voltage table includes: performing a read operation on the specific region respectively according to each threshold voltage recorded in the optimal threshold voltage table, and acquiring a second piece of cell state distribution information corresponding to the each threshold voltage; acquiring an offset parameter of the each threshold voltage according to the first piece of cell state distribution information and the second piece of cell state distribution information; and updating each threshold voltage recorded in the optimal threshold voltage table according to the offset parameter.

In some embodiments, at least one threshold voltage has been recorded in the optimal threshold voltage table. For example, taking TLC-type flash particles as an example, there will be 7 threshold voltages in each word line, and the 7 threshold voltages may be recorded as initial threshold voltages in the optimal threshold voltage table. A read operation may be performed for the specific region respectively based on the recorded initial threshold voltages, thereby obtaining the second piece of cell state distribution information corresponding to each threshold voltage. Because the preset data sequence has been pre-written in the specific region, and the first piece of cell state distribution information is determined, the determined first piece of cell state distribution information may be compared with the currently obtained second piece of cell state distribution information, so as to obtain an offset parameter of each threshold voltage. The offset parameter includes an offset amount and an offset degree, and each threshold voltage can be updated according to the offset parameter.

In some embodiments, the acquiring the offset parameter of the each threshold voltage according to the determined first piece of cell state distribution information and the second piece of cell state distribution information includes:
  acquiring an initial number of cells and an initial record value according to the determined first piece of cell state distribution information;
  acquiring a current number of cells and a current record value corresponding to the each threshold voltage according to the second piece of cell state distribution information; and
  comparing the initial number of cells with the current number of cells to obtain an offset direction of the each threshold voltage, and comparing the initial record value with the current record value to obtain an offset degree of the each threshold voltage.

The first piece of cell state distribution information and the second piece of cell state distribution information both include the number of cells and a record value. The number of cells is the cell count. The record value includes a state value, which is embodied as a set of values of "proportions of distribution states." For example, the state value includes at least one of a ratio or a percentage of the number of cells to a total number of cells in each voltage distribution state.

The updating each threshold voltage recorded in the optimal threshold voltage table according to the offset parameter includes: determining the adjusted threshold voltage according to the offset direction and the offset degree of the threshold voltage, and recording the adjusted threshold voltage in the optimal threshold voltage table.

The adjusted threshold voltage corresponding to each voltage state=initial value±offset degree: when the offset direction is left offset, the adjusted threshold voltage corresponding to each voltage state=initial value+offset degree; and when the offset direction is right offset, the adjusted threshold voltage corresponding to each voltage state=initial value−offset degree.

When the above adjusted threshold voltage includes a plurality of threshold voltages, an adjusted threshold voltage corresponding to a smallest number of bit errors can be found, and the adjusted threshold voltage is a current optimal threshold voltage. With the periodic update, the optimal threshold voltage will also become other threshold voltage.

The above number of cells and record value are obtained when a preset data sequence is written into the specific region, and are compared with the number of cells and record value obtained when the read operation is performed according to the initial threshold voltage, thereby obtaining the adjusted threshold voltage, and updating the initial threshold voltage recorded in the optimal threshold voltage table according to the adjusted threshold voltage.

Based on the above process, when the preset scanning interval is reached again, the adjusted threshold voltage is obtained again according to the updated threshold voltage recorded in the optimal threshold voltage table and the number of cells and the record value obtained when the preset data sequence is written into the specific region, thereby periodically scanning the optimal threshold voltage.

The basic principle of the above optimal threshold voltage scanning is that: when the written data is determined, its cell distribution on a corresponding NAND flash is also determined, that is, the number of cells in each state is determined. When data is read, the number of cells in each state is recomputed for the read data, and then each state is compared, so as to infer a state offset direction and set the threshold voltage. After read retry, computation, and comparison are repeated several times, the threshold voltage corresponding to the smallest number of bit errors is found for use as the optimal threshold voltage.

In some embodiments, the method further includes: acquiring an updated threshold voltage in the optimal threshold voltage table and an initial threshold voltage corresponding to the updated threshold voltage: computing an offset amount between the updated threshold voltage and the initial threshold voltage; and performing a data transfer operation when the offset amount is greater than the set threshold. An offset of the optimal threshold voltage relative to the initial threshold voltage reflects an offset degree of each voltage state. Therefore, if the offset of the optimal threshold voltage is too large, data transfer should be considered to avoid a phenomenon that "not all errors can be corrected even if the optimal threshold voltage is used."

In some embodiments, the optimal threshold voltage scanning is performed periodically, and is not performed when necessary, thereby improving the efficiency of obtaining the optimal threshold voltage, and the threshold voltage scanning is performed for the specific region, thereby reducing the number of read operations during scanning, improving the efficiency of obtaining the optimal threshold voltage, reducing delay impact of other read and write operations, and improving system performance.

In addition, the periodic scanning is equivalent to real-time tracking of the optimal threshold voltage, so that it is feasible to detect threshold voltage offset to a risk point as early as possible, and perform data transfer as early as possible, thus reducing occurrence of uncorrectable errors. The periodic scanning is generally back-end scanning under active control of software. Generally, in consumer-level solid-state storage, due to the existence of idle time, scanning may be performed in the idle time, thereby covering up the time consumed for scanning. However, in enterprise-level solid-state storage, generally, under long-term operation of a system, the periodic scanning is performed as a periodic back-end task, and the time consumed for scanning is shared over a period of time, so that there will not be sudden decline of performance.

Figure 4:
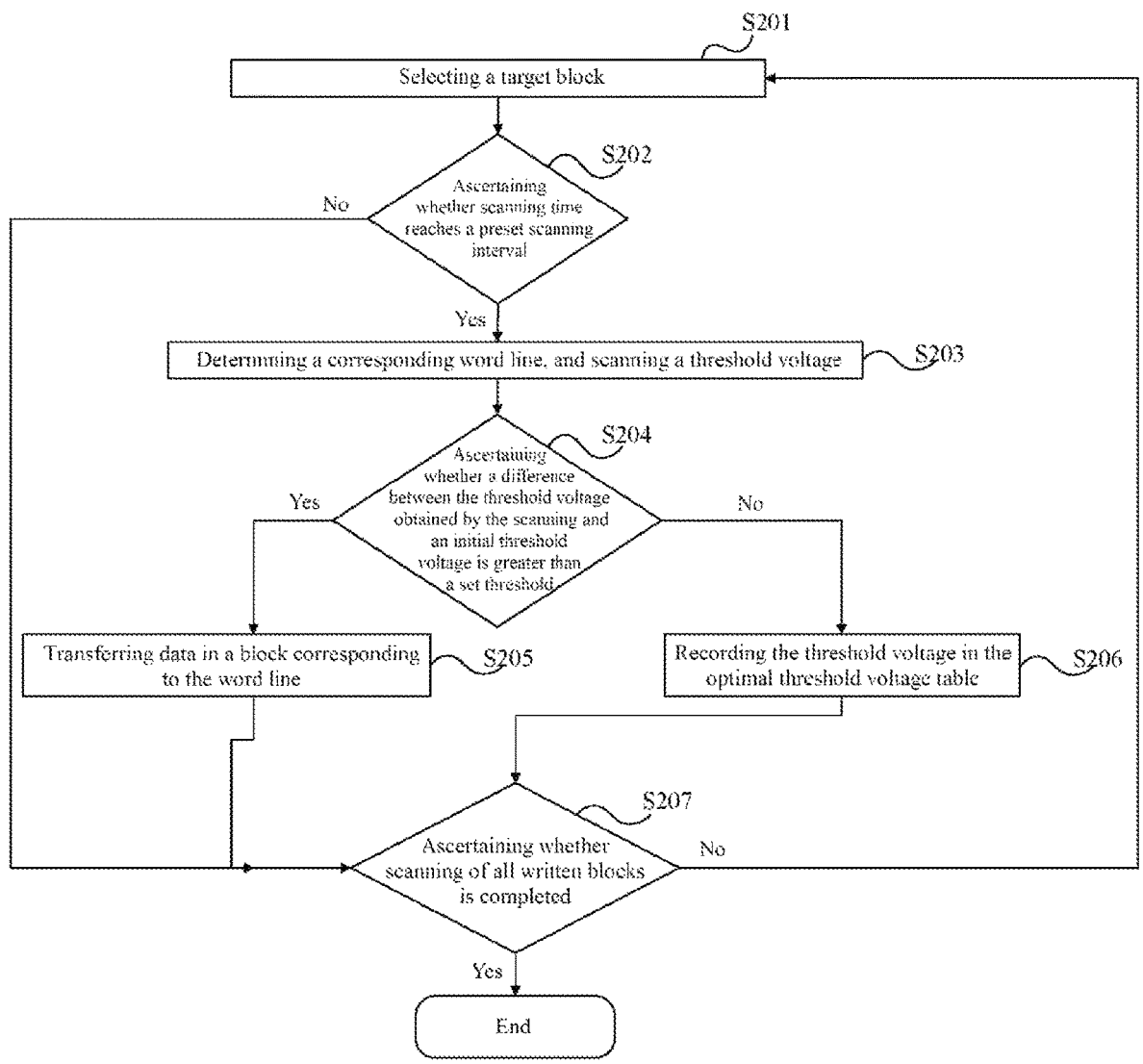
FIG. 4 is a flowchart of a method for periodically scanning an optimal threshold voltage to establish an optimal threshold voltage table provided in an embodiment of the present application.

Referring to FIG. 4, based on the above method embodiments, a detailed process of periodically scanning the optimal threshold voltage to establish the optimal threshold voltage table is provided below, including:

S201: selecting a target block;

S202: ascertaining whether scanning time reaches a preset scanning interval;

executing the following steps S203 and S204 if the scanning time reaches the preset scanning interval; and completing the scanning if the scanning time does not reach the preset scanning interval.

S203: determining a corresponding word line, and scanning a threshold voltage:

S204: ascertaining whether a difference between the threshold voltage obtained by the scanning and an initial threshold voltage is greater than a set threshold:

executing the following steps S205 and S207 if the difference between the threshold voltage obtained by the scanning and the initial threshold voltage is greater than the set threshold; and executing the following steps S206 and S207 if the difference between the threshold voltage obtained by the scanning and the initial threshold voltage is less than or equal to the set threshold.

S205: transferring data in a block corresponding to the word line;

S206: recording the threshold voltage in the optimal threshold voltage table;

S207: ascertaining whether scanning of all written blocks is completed;

jumping to the above step S201 if the scanning of all written blocks is not completed; and completing the scanning if the scanning of all written blocks is completed.

Through the above process, an optimal threshold voltage table can be periodically established, a threshold voltage satisfying requirements during each scanning is recorded in the optimal threshold voltage table, and the threshold voltage is taken as an optimal threshold voltage corresponding to a current block at a current moment.

Figures 5, 6, 7:
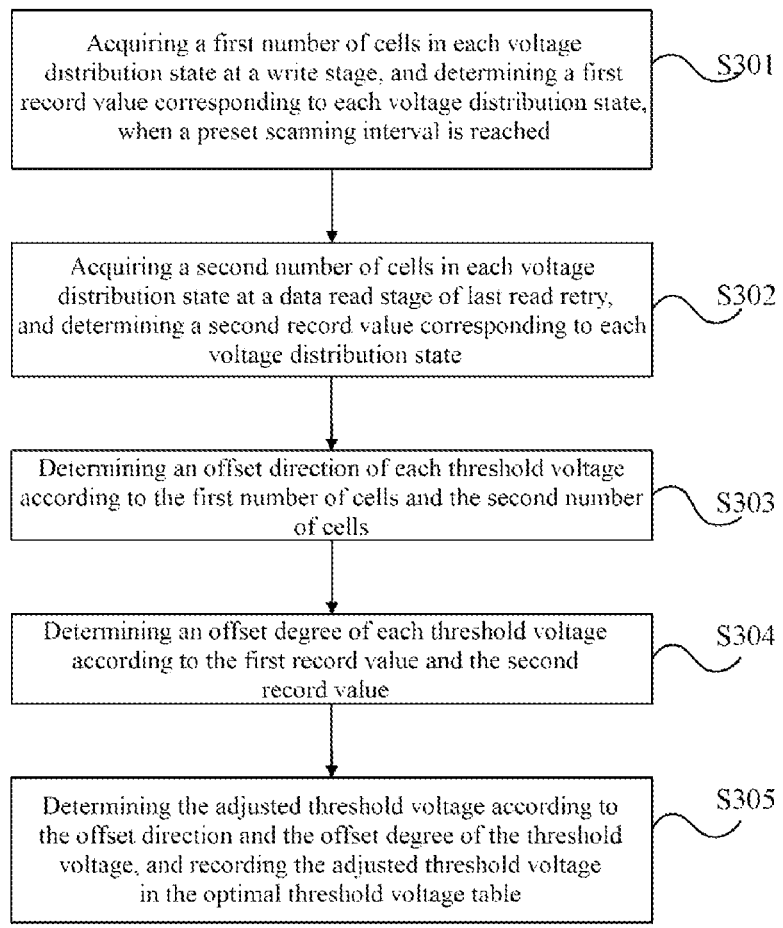
FIG. 5 and FIG. 6 are schematic diagrams of an optimal threshold voltage table provided in an embodiment of the present application.
FIG. 7 is a flowchart of a method for periodically updating the optimal threshold voltage table provided in an embodiment of the present application.

For example, as shown in FIG. 5 and FIG. 6, schematic diagrams of an optimal threshold voltage table are provided. Taking TLC-type flash particles as an example, there are 7 threshold voltages in each word line. In order to save the optimal threshold voltage obtained by periodic scanning, maintenance may be performed with a block as a granularity through the table shown in FIG. 5, in order to reduce the demand for storage resources. It should be noted that in a specific implementation, in order to manage a scanning period, corresponding values in FIG. 5 not only include threshold voltage values (including threshold voltages in all states, i.e., the 7 threshold voltages of TLC type shown in FIG. 5), but also include time stamps and other management information as shown in FIG. 6.

In some implementations, management and maintenance of the optimal threshold voltage table include: when a solid state disk runs in real time, the optimal threshold voltage table is stored in a DRAM, and will be stored in NAND or other non-volatile memory like management of other tables, because the solid state disk may lose power. After power-on, it is restored.

It can be known that the threshold voltage in the optimal threshold voltage table is periodically updated, thus ensuring that the optimal threshold voltage can be obtained in real time.

It should be noted that the optimal threshold voltage scanning process in the embodiments of the present application is non-blocking. That is, in the scanning process, the process of reading data each time can be independent, such that other operations, such as read/write, can be inserted. In some embodiments, a task may be managed using a state machine or a scanning task may be managed using a thread, and the scanning may be decomposed into a plurality of fragment operations, in which special RAM space is required to record data, computing results, and operating parameters of each operation fragment.

Referring to FIG. 7, a detailed process of periodically updating the optimal threshold voltage table is provided below, including:

S301: acquiring a first number of cells in each voltage distribution state at a write stage, and determining a first record value corresponding to each voltage distribution state when a preset scanning interval is reached.

In some embodiments, by considering the information from the previous read retry before the current read retry, this application provides a correct adjustment direction for the current read retry. The first number of cells in each voltage distribution state at the write stage is acquired, and the first record value corresponding to each voltage distribution state is determined, where the first record value includes a first state value, where the first state value is embodied as a set of values of "proportions of distribution states." For example, the first state value includes at least one of a ratio or a percentage of the first number of cells to a total number of cells in each voltage distribution state.

S302: acquiring a second number of cells in each voltage distribution state at a data read stage of last read retry, and determining a second record value corresponding to each voltage distribution state.

It is understandable that the read stage of the last read retry is after the write stage, the second number of cells in each voltage distribution state at the read stage of the last read retry is acquired, and the second record value corresponding to each voltage distribution state is determined, where the second record value includes a second state value, where the second state value is embodied as a set of values of "proportions of distribution states." For example, the second state value includes at least one of a ratio or a percentage of the first number of cells to the total number of cells in each voltage distribution state.

S303: determining an offset direction of each threshold voltage according to the first number of cells and the second number of cells.

In some embodiments, the first number of cells reflects the number of cells in each voltage distribution state at the write stage of the previous read retry, and the second number of cells reflects the number of cells in each voltage distribution state at the read stage of the previous read retry, the first number of cells is compared with the second number of cells to determine a change trend of the number of cells, thereby ascertaining the offset direction of each threshold voltage. For example, when the first number of cells in a state ER is less than the second number of cells, an offset direction of a threshold voltage V1 is determined to be right offset, and when the first number of cells in the state ER is greater than the second number of cells, the offset direction of the threshold voltage V1 is determined to be left offset.

The first number of cells and the second number of cells in each voltage distribution state are determined, thereby determining the offset direction of each threshold voltage. In the embodiments of the present application, the threshold voltage can be better adjusted.

S304: determining an offset degree of each threshold voltage according to the first record value and the second record value.

The first record value includes a first state value, and the second record value includes a second state value. In some embodiments, the first state value is a first percentage value, and the second state value is a second percentage value. The determining the offset degree of each threshold voltage according to the first record value and the second record value includes:

Step 1: computing a difference between the first state value and the second state value.

Assuming that voltage states are arranged in ascending order, a first voltage state is the state ER, a second voltage state is a state A, . . . , and an eighth voltage state is a state G;

in case of right offset of the voltage distribution, its statistical value is computed as per the following equations (1) and (2):

$$Ccnt(N')=Ccnt(N)-\Delta X; \qquad (1)$$

$$Ccnt(N+1')=Ccnt(N+1)+\Delta X\pm\Delta N+1\_N+2; \qquad (2)$$

Ccnt(N) is the number of cells in an Nth voltage state at the write stage, Ccnt(N') is the number of cells in the $N^{th}$ voltage state at the read stage, Ax is an offset amount of right offset of the $N^{th}$ voltage state, Ccnt(N+1) is the number of cells in an $(N+1)^{th}$ voltage state at the write stage, Ccnt(N+1') is the number of cells in the $(N+1)^{th}$ voltage state at the read stage, and ΔN+1_N+2 is an offset amount in the $(N+1)^{th}$ voltage state.

In case of left offset of the voltage distribution, its statistical value is computed as per the following equations (3) and (4):

$$Ccnt(N')=Ccnt(N)+\Delta M; \qquad (3)$$

$$Ccnt(N+1')=Ccnt(N+1)-\Delta M\pm\Delta N+1\_N+2; \qquad (4)$$

Ccnt(N) is the number of cells in the NI voltage state at the write stage, Ccnt(N') is the number of cells in the $N^{th}$ voltage state at the read stage, AM is an offset amount of left offset of the $N^{th}$ voltage state. Ccnt(N+1) is the number of cells in an $(N+1)^{th}$ voltage state at the write stage, Ccnt(N+1') is the number of cells in the $(N+1)^{th}$ voltage state at the read stage, and ΔN+1_N+2 is an offset amount in the $(N+1)^{th}$ voltage state.

It is understandable that the offset amount ΔN+1_N+2 may be the offset amount of left offset, or may be the offset amount of right offset. When the offset amount ΔN+1_N+2 is the offset amount of left offset, equation (2) is Ccnt(N+1')=Ccnt(N+1)+ΔX+ΔN+1_N+2, and equation (4) is Ccnt(N+1')=Ccnt(N+1)-ΔM+ΔN+1_N+2; and when the offset amount ΔN+1_N+2 is the offset amount of right offset, equation (2) is Ccnt(N+1')=Ccnt(N+1)+ΔX-ΔN+1_N+2, and equation (4) is Ccnt(N+1')=Ccnt(N+1)-ΔM-ΔN+1_N+2.

Figure 8:
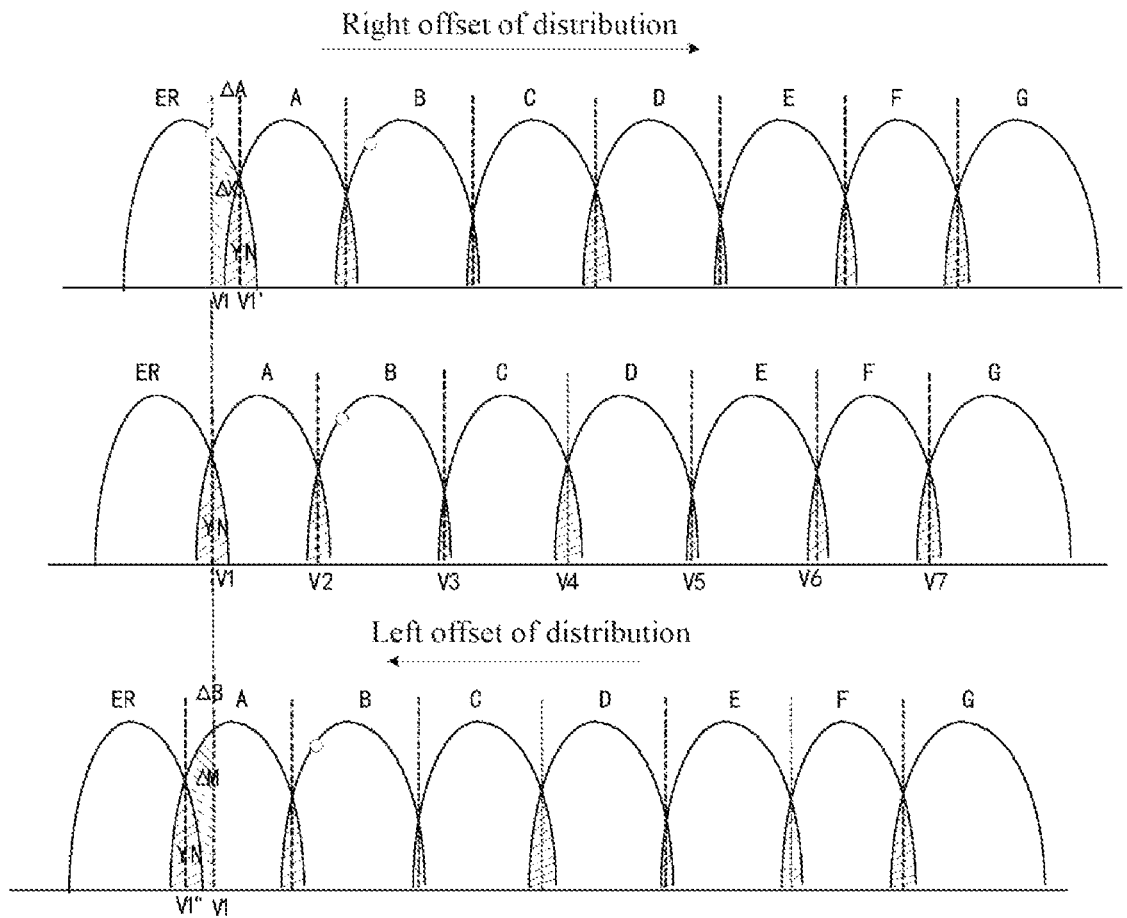
FIG. 8 is a schematic diagram of a voltage distribution provided in an embodiment of the present application.

In some embodiments, referring to FIG. 8, which is a schematic diagram of a voltage distribution provided in the present application.

As shown in an upper part of FIG. 8, the state ER is taken as an example for description. When read settings remain at the threshold voltage V1, it is known that the number of cells in the state ER decreases by ΔX within a voltage range ΔA, the number of cells in the state A increases by ΔX only when the threshold voltage V1 is considered, and if the threshold voltage V2 is considered, a position of a threshold voltage V2 relative to a waveform needs to be considered, so that when the threshold voltage remains at an original value after waveform offset, the number of cells changes as follows:

$$Ccnt(ER')=Ccnt(ER)-\Delta X$$

$$Ccnt(A')=Ccnt(A)+\Delta X+\Delta A\_B$$

Ccnt(ER') is in state, Ccnt(ER) is the number of cells in the state ER, ΔX is the offset amount of right offset, and ΔA_B is associated with offset of the threshold voltage V2.

Otherwise, if left offset of the voltage distribution occurs, as shown in a lower half of FIG. 8, the number of cells in the state ER increases by ΔM, while the number of cells in state A decreases by ΔM.

$$Ccnt(ER')=Ccnt(ER)+\Delta M$$

$$Ccnt(A')=Ccnt(A)-\Delta M+\Delta A\_B$$

During writing and reading, the number of cells in all voltage distribution states is tracked and compared. For example, Ccnt(ER) is counted and recorded during write, and Ccnt(ER') is counted during read, thereby knowing about the increase and decrease of ΔM. Based on a trend that the number of cells changes in a corresponding state when the above offset occurs, its offset direction is inferred. For example, when read data shows that the number of cells in the state ER decreases, right offset of the waveform occurs relative to the V1, and when a new V1' is set, it should be adjusted in a reverse direction: adjusted leftward, so as to obtain an optimal threshold voltage Vth. For V2, after the number of cells in the state ER is determined to have a change, the change trend of the number of cells in state A can be determined, thus the adjustment direction of V2 can be inferred accordingly. Other V3-V7 can be inferred sequentially.

It is understandable that despite of left offset or right offset, a size of a deviation amount (ΔX/ΔM) represents an offset degree (which can be understood as distances of V1' and V1" from V1). Therefore, the size of the deviation amount can be used as a step size for setting the new threshold voltage Vth.

In some embodiments, the difference between the first state value and the second state value is computed, where the difference between the first state value and the second state value can be used for representing the deviation amount, so as to determine a stepping amount according to the difference between the first state value and the second state value.

Step 2: determining a stepping amount according to the difference.

In some embodiments, the stepping amount is determined based on the difference according to a preset corresponding relationship between the difference and the stepping amount, for example. the corresponding relationship between the difference and the stepping amount is: stepping amount=adjustment coefficient*difference, and the stepping amount is determined through the corresponding relationship according to the difference.

Step 3: determining the offset degree of the threshold voltage according to the stepping amount.

According to the stepping amount, the stepping amount is determined for use as the offset degree of the threshold voltage, i.e., stepping amount=offset degree.

S305: determining the adjusted threshold voltage according to the offset direction and the offset degree of the threshold voltage, and recording the adjusted threshold voltage in the optimal threshold voltage table.

In some embodiments, the adjusted threshold voltage corresponding to each voltage state=initial value±offset degree; where when the offset direction is left offset, the adjusted threshold voltage corresponding to each voltage state=initial value+offset degree; and when the offset direction is right offset, the adjusted threshold voltage corresponding to each voltage state=initial value−offset degree.

In some embodiments, voltage distribution state information of target data is tracked, and a change trend of the number of cells in a voltage distribution state during write and read is computed, to infer a voltage distribution offset direction, so that a threshold voltage is adjusted in a reverse direction during read retry to achieve direction adjustment of the threshold voltage; and then the voltage distribution state information of the target data is tracked, and a change degree of the number of cells in the voltage distribution state during write and read is computed, to achieve threshold adjustment of the threshold voltage. In some embodiments, the threshold voltage can be better adjusted to reduce the number of error bits, and improve overall read performance of the solid state disk.

Figure 9:
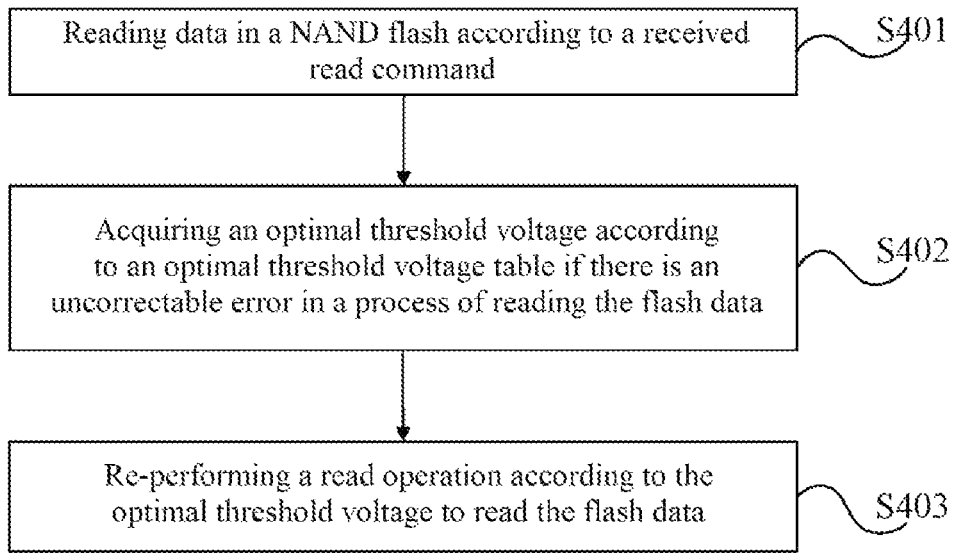
FIG. 9 is a flowchart of a method for reading flash data provided in an embodiment of the present application.

Referring to FIG. 9, based on the above method embodiments, some embodiments of the present application provide a method for reading flash data, including:

S401: reading data in a NAND flash according to a received read command;

S402: acquiring an optimal threshold voltage according to an optimal threshold voltage table if there is an uncorrectable error in a process of reading the flash data;

where the optimal threshold voltage table is determined according to the method for managing a threshold voltage in the above embodiments, and the above method embodiments may be referred to for details; and S403: re-performing a read operation according to the optimal threshold voltage to read the flash data.

In some embodiments, when an uncorrectable error occurs in a process of reading the flash data, a real-time optimal threshold voltage can be obtained from an optimal threshold voltage table, so that a read operation can be re-performed, where the optimal threshold voltage table is obtained according to the above method embodiments, and is a result obtained by periodically scanning a threshold voltage.

The method provided in the present application can more effectively correct errors, improve the efficiency of reading the flash data, and improve overall performance of the solid state disk.

Figure 10:
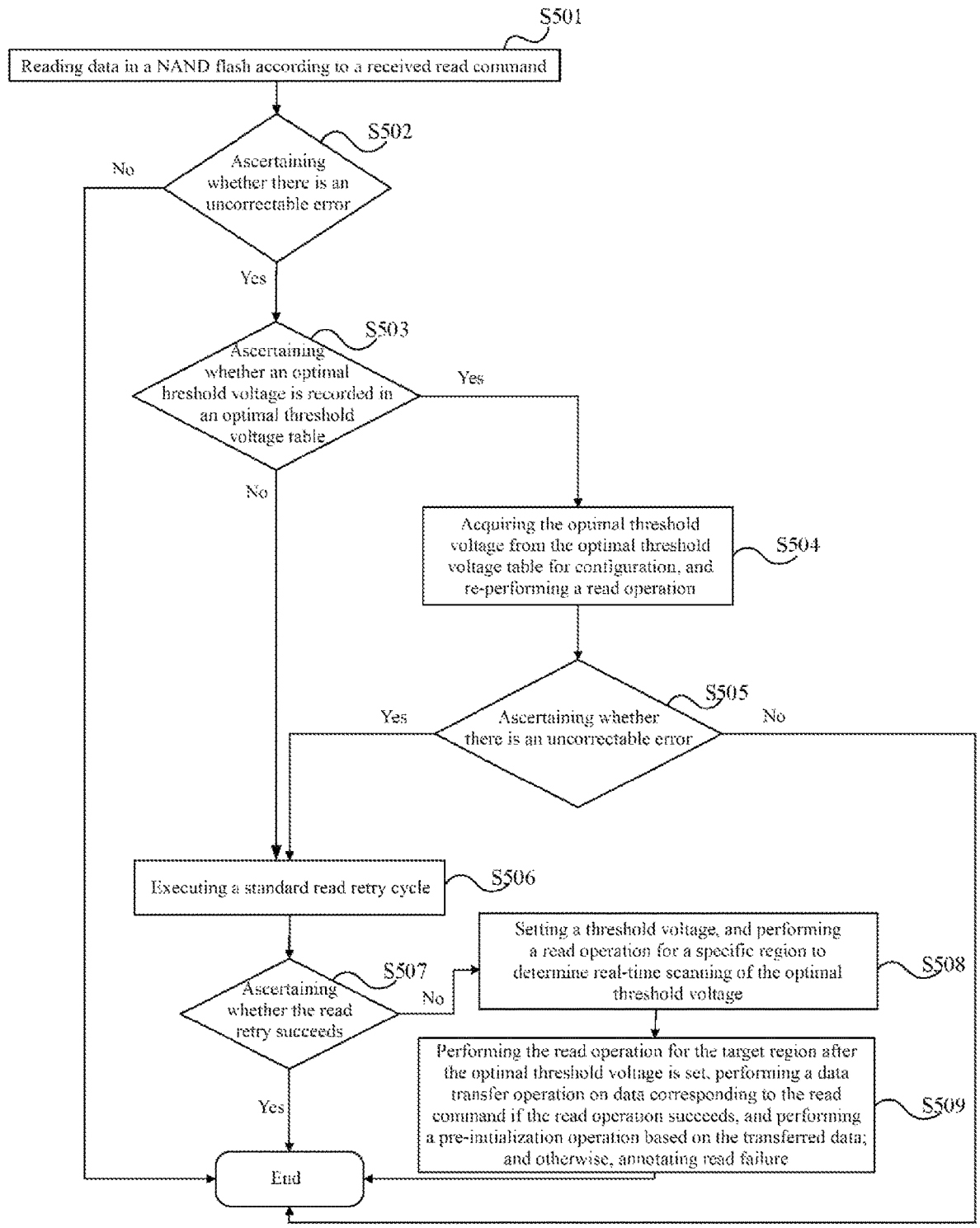
FIG. 10 is a flowchart of a method for reading flash data provided in another embodiment of the present application.

Referring to FIG. 10, some embodiments of the present application provide a method for reading flash data, including:

S501: reading data in a NAND flash according to a received read command;

S502: ascertaining whether there is an uncorrectable error;

executing the following step S503 if there is an uncorrectable error; and completing the processing if there is not an uncorrectable error.

S503: ascertaining whether an optimal threshold voltage is recorded in an optimal threshold voltage table:

executing the following steps S504 and S505 if an optimal threshold voltage is recorded in the optimal threshold voltage table; and executing the following step S506 if no optimal threshold voltage is recorded in the optimal threshold voltage table.

S504: acquiring the optimal threshold voltage from the optimal threshold voltage table for configuration, and re-performing a read operation:

S505: ascertaining whether there is an uncorrectable error;

executing the following steps S506 and S507 if there is an uncorrectable error; and completing the processing if there is not an uncorrectable error.

S506: executing a standard read retry cycle;

S507: ascertaining whether the read retry succeeds;

executing the following steps S508 and S509 if the read retry succeeds; and completing the processing if the read retry fails.

S508: setting a threshold voltage, and performing a read operation for a specific region to determine real-time scanning of the optimal threshold voltage;

S509: performing the read operation for the target region after the optimal threshold voltage is set, performing a data transfer operation on data corresponding to the read command if the read operation succeeds, and performing a pre-initialization operation based on the transferred data; and otherwise, annotating read failure.

The data transfer operation is to transfer data to a new block. In this case, the pre-initialization operation may be performed, including: computing cell state distribution information corresponding to the transferred data; selecting a specific word line; writing the transferred data into the specific word line: performing an optimal threshold voltage scanning for the word line, using the obtained threshold voltage as an initial threshold voltage, and saving the initial threshold voltage.

In some embodiments, if the optimal threshold voltage has been maintained, the recorded optimal threshold voltage will be directly applied when there is an uncorrectable error in the read data, thereby greatly improving a success rate of the read retry. If there is no record or there is still a read error after the recorded threshold voltage is used, a standard process will still be followed. After the read retry operation, a real-time optimal threshold voltage scanning at a word line level is performed, that is, when the optimal threshold voltage recorded at a block level is ineffective, the optimal threshold voltage scanning at the word line level is still performed. Because it is time to read data only by using the optimal threshold voltage, data on a block including the word line is in a high-risk state, and it is necessary to transfer the data to avoid a phenomenon that "not all errors can be corrected even if the optimal threshold voltage is used."

The method provided in the present application can more effectively correct errors, improve the efficiency of reading the flash data, and improve overall performance of the solid state disk.

Some embodiments of the present application further provide a non-volatile computer storage medium, storing computer-executable instructions, where the computer-executable instructions are executed by one or more processors, for example, the one or more processors can execute the method for managing a threshold voltage or the method for reading flash data in any of the above method embodiments.

Some embodiments of the present application provide a computer program product, including a computer program stored on a non-volatile computer-readable storage medium, where the computer program includes program instructions. The program instructions, when executed by a mobile terminal, enable the mobile terminal to execute a power saving method of the mobile terminal in any of the above method embodiments, for example, executing step 101 to step 102 of the method in FIG. 3, step 301 to step 305 of the method in FIG. 7, and step 401 to step 403 of the method in FIG. 9.

The apparatus or device described above is merely illustrative, where the unit modules described as separate components may or may not be physically separated, the components illustrated as module units may or may not be physical units, that is, they may be located in the same place or may be distributed to a plurality of network module units.

A part or all of the modules may be selected according to actual requirements to achieve the purpose of the solutions of the present embodiment From the description of the above embodiments, those skilled in the art can clearly understand that each embodiment can be implemented by means of software plus general hardware platform, and of course, can also be implemented by hardware. Based on such understanding, the above technical solutions essentially, or a part of the above technical solutions that contributes to associated technologies may be embodied in the form of a software product which is stored in a computer-readable storage medium, such as a ROM/RAM, diskette, or optical disk, and includes some instructions for causing a computer device (which may be a personal computer, a server, or a network device, and so on) to execute the method according to the embodiments or some parts of the embodiments.

Finally, it should be noted that: the above embodiments are merely used to illustrate the technical solutions of the present application, instead of imposing any limitation on the technical solutions. Based on the concept of the present application, combinations may be made between the technical features in the above embodiments or in different embodiments, the steps may be implemented in any order, and there are many other variations in different aspects of the present application as described above, which are not provided in detail for the sake of brevity. While the present application is described in detail with reference to the above embodiments, those of ordinary skills in the art should understand that: the technical solutions disclosed in the above embodiments may still be modified or a part of the technical features thereof may be replaced equivalently. These modifications and replacements are not intended to make the essence of corresponding technical solutions depart from the scope of the technical solutions of the embodiments of the present application.

What is claimed is:

1. A method for managing one or more threshold voltages, comprising:
    acquiring a target block comprising a subregion that is programmed with a preset data sequence, such that the subregion of the target block has a first piece of cell state distribution information determined based on the preset data sequence; and
    when a preset scanning interval is reached, scanning the one or more threshold voltages based on the sub-region of the target block, the first piece of cell state distribution information, and an optimal threshold voltage table that stores the one or more threshold voltages, and periodically managing the optimal threshold voltage table.

2. The method according to claim 1, wherein the sub-region of the target block comprises a word line in the target block.

3. The method according to claim 2, wherein scanning the one or more threshold voltages based on the sub-region of the target block, the first piece of cell state distribution information, and the optimal threshold voltage table comprises:
    performing a read operation on the sub-region respectively according to each threshold voltage recorded in the optimal threshold voltage table, and acquiring a second piece of cell state distribution information corresponding to the corresponding threshold voltage;
    acquiring an offset parameter of the corresponding threshold voltage according to the first piece of cell state distribution information and the second piece of cell state distribution information; and
    updating the corresponding threshold voltage recorded in the optimal threshold voltage table according to the offset parameter.

4. The method according to claim 3, wherein acquiring the offset parameter of the corresponding threshold voltage according to the first piece of cell state distribution information and the second piece of cell state distribution information comprises:
    acquiring an initial number of cells and an initial record value according to the first piece of cell state distribution information;
    acquiring a current number of cells and a current record value corresponding to the corresponding threshold voltage according to the second piece of cell state distribution information; and
    comparing the initial number of cells with the current number of cells to obtain an offset direction of the corresponding threshold voltage, and comparing the initial record value with the current record value to obtain an offset degree of the corresponding threshold voltage.

5. The method according to claim 4, wherein updating the corresponding threshold voltage recorded in the optimal threshold voltage table according to the offset parameter comprises:
    determining an adjusted threshold voltage according to the offset direction and the offset degree of the corresponding threshold voltage, and updating and recording the adjusted threshold voltage in the optimal threshold voltage table.

6. The method according to claim 1, further comprising:
    acquiring an updated threshold voltage in the optimal threshold voltage table and an initial threshold voltage corresponding to the updated threshold voltage;
    computing an offset amount between the updated threshold voltage and the initial threshold voltage; and
    performing a data transfer operation when the offset amount is greater than a set threshold.

7. The method according to claim 6, wherein acquiring the updated threshold voltage in the optimal threshold voltage table comprises periodically scanning an optimal threshold voltage to establish the optimal threshold voltage table.

8. The method according to claim 7, wherein periodically scanning the optimal threshold voltage comprises:
    selecting a block to be the target block; and
    determining whether a scanning time reaches the preset scanning interval.

9. The method according to claim 8, wherein when the scanning time reaches the preset scanning interval, the method further comprises:
    determining a corresponding word line, and scanning a threshold voltage; and
    determining whether a difference between the threshold voltage obtained by the scanning and an initial threshold voltage is greater than a set threshold.

10. The method according to claim 8, wherein when the scanning time does not reach the preset scanning interval, the method further comprises:
    completing the scanning.

11. The method according to claim 9, wherein when the difference between the threshold voltage obtained by the scanning and the initial threshold voltage is greater than the set threshold, the method further comprises:
    transferring data in a block associated with the corresponding word line; and determining whether a scanning of all written blocks is completed.

12. The method according to claim 9, wherein when the difference between the threshold voltage obtained by the scanning and the initial threshold voltage is less than or equal to the set threshold, the method further comprises:
   recording the threshold voltage in the optimal threshold voltage table; and
   determining whether a scanning of all written blocks is completed.

13. The method according to claim 12, wherein:
   when the scanning of all written blocks is not completed, the method further comprises:
      selecting another block to be the target block and determining whether the scanning time reaches the preset scanning interval; and
   when the scanning of all written blocks is completed, the method further comprises:
      completing the scanning.

14. A method for reading flash data, comprising:
   reading data in a NAND flash according to a received read command;
   acquiring an optimal threshold voltage according to an optimal threshold voltage table when there is an uncorrectable error during the reading of the data; and
   re-performing a first read operation according to the optimal threshold voltage to read the data in the NAND flash,
   wherein the optimal threshold voltage table is determined at least by:
      acquiring a target block comprising a subregion that is programmed with a preset data sequence, such that the subregion of the target block has a first piece of cell state distribution information determined based on the preset data sequence; and
      when a preset scanning interval is reached, scanning one or more threshold voltages based on the sub-region of the target block, the first piece of cell state distribution information, and the optimal threshold voltage table that stores the one or more threshold voltages, and periodically managing the optimal threshold voltage table.

15. The method according to claim 14, wherein when the re-performing the first read operation according to the optimal threshold voltage fails, the method further comprises:
   performing an optimal threshold voltage scanning to obtain the optimal threshold voltage;
   performing a second read operation for a target region according to the obtained optimal threshold voltage; and
   performing a data transfer operation on the data corresponding to the received read command when the second read operation succeeds.

16. A solid state disk controller, comprising:
   one or more processors; and
   a memory storing a program, wherein when the program is executed by the one or more processors, the program causes the one or more processors to execute operations comprising:
      acquiring a target block comprising a subregion that is programmed with a preset data sequence, such that the subregion of the target block has a first piece of cell state distribution information determined based on the preset data sequence; and
      when a preset scanning interval is reached, scanning one or more threshold voltages based on the sub-region of the target block, the first piece of cell state distribution information, and an optimal threshold voltage table that stores the one or more threshold voltages, and periodically managing the optimal threshold voltage table.

17. The solid state disk controller according to claim 16, wherein the sub-region of the target block comprises a word line in the target block.

18. The solid state disk controller according to claim 17, wherein scanning the one or more threshold voltages based on the sub-region of the target block, the first piece of cell state distribution information, and the optimal threshold voltage table comprises:
   performing a read operation on the sub-region respectively according to each threshold voltage recorded in the optimal threshold voltage table, and acquiring a second piece of cell state distribution information corresponding to the corresponding threshold voltage;
   acquiring an offset parameter of the corresponding threshold voltage according to the first piece of cell state distribution information and the second piece of cell state distribution information; and
   updating the corresponding threshold voltage recorded in the optimal threshold voltage table according to the offset parameter.

19. The solid state disk controller according to claim 18, wherein acquiring the offset parameter of the corresponding threshold voltage according to the first piece of cell state distribution information and the second piece of cell state distribution information comprises:
   acquiring an initial number of cells and an initial record value according to the first piece of cell state distribution information;
   acquiring a current number of cells and a current record value corresponding to the corresponding threshold voltage according to the second piece of cell state distribution information; and
   comparing the initial number of cells with the current number of cells to obtain an offset direction of the corresponding threshold voltage, and comparing the initial record value with the current record value to obtain an offset degree of the corresponding threshold voltage.

20. The method according to claim 1, further comprising programming the preset data sequence into the subregion of the target block at least by:
   selecting the preset data sequence;
   computing and saving the first piece of cell state distribution information corresponding to the preset data sequence;
   selecting the subregion in the target block; and
   programming the preset data sequence into the subregion.

* * * * *